(12) United States Patent
Griebenow et al.

(10) Patent No.: US 8,198,633 B2
(45) Date of Patent: Jun. 12, 2012

(54) STRESS TRANSFER ENHANCEMENT IN TRANSISTORS BY A LATE GATE RE-CRYSTALLIZATION

(75) Inventors: Uwe Griebenow, Markkleeberg (DE); Jan Hoentschel, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 38 days.

(21) Appl. No.: 12/565,020

(22) Filed: Sep. 23, 2009

(65) Prior Publication Data

US 2010/0109012 A1 May 6, 2010

(30) Foreign Application Priority Data

Oct. 31, 2008 (DE) .................. 10 2008 053 955

(51) Int. Cl.
*H01L 29/78* (2006.01)
*H01L 21/336* (2006.01)
*H01L 21/20* (2006.01)
(52) U.S. Cl. ......... 257/66; 257/315; 257/412; 257/438; 257/E21.177; 257/E21.176; 438/300; 438/360
(58) Field of Classification Search .............. 257/66, 257/315, 412–438, E21.177, E21.176; 438/300–360
See application file for complete search history.

(56) References Cited

U.S. PATENT DOCUMENTS

2004/0061191 A1* 4/2004 Paton et al. .................. 257/412
2007/0080393 A1 4/2007 Togo et al. .................. 257/315

FOREIGN PATENT DOCUMENTS

EP 0 598 409 A1 2/1990

OTHER PUBLICATIONS

Translation of Official Communication from German Patent Office for German Patent Application No. 10 2008 053 955.4 dated Aug. 18, 2009.

* cited by examiner

*Primary Examiner* — Cuong Q Nguyen
*Assistant Examiner* — Cathy N Lam
(74) *Attorney, Agent, or Firm* — Williams, Morgan & Amerson, P.C.

(57) ABSTRACT

A gate electrode structure of a transistor may be formed so as to exhibit a high crystalline quality at the interface formed with a gate dielectric material, while upper portions of the gate electrode may have an inferior crystalline quality. In a later manufacturing stage after implementing one or more strain-inducing mechanisms, the gate electrode may be re-crystallized, thereby providing increased stress transfer efficiency, which in turn results in an enhanced transistor performance.

23 Claims, 5 Drawing Sheets

STRESS TRANSFER ENHANCEMENT IN TRANSISTORS BY A LATE GATE RE-CRYSTALLIZATION

BACKGROUND OF THE INVENTION

1. Field of the Invention

Generally, the present disclosure relates to integrated circuits, and, more particularly, to transistors having strained channel regions by using stress-inducing sources, such as stressed sidewall spacers of gate electrodes, embedded strain-inducing semiconductors alloys and the like, to enhance charge carrier mobility in the channel region of a MOS transistor.

2. Description of the Related Art

Generally, a plurality of process technologies are currently practiced to fabricate integrated circuits, wherein, for complex circuitry, such as microprocessors, storage chips and the like, CMOS technology is currently one of the most promising approaches due to the superior characteristics in view of operating speed and/or power consumption and/or cost efficiency. During the fabrication of complex integrated circuits using CMOS technology, millions of transistors, i.e., N-channel transistors and P-channel transistors, are formed on a substrate including a crystalline semiconductor layer. A MOS transistor, irrespective of whether an N-channel transistor or a P-channel transistor is considered, comprises so-called PN junctions that are formed by an interface of highly doped drain and source regions with an inversely or weakly doped channel region disposed between the drain region and the source region. The conductivity of the channel region, i.e., the drive current capability of the conductive channel, is controlled by a gate electrode located close to the channel region and separated therefrom by a thin insulating layer. The conductivity of the channel region, upon formation of a conductive channel due to the application of an appropriate control voltage to the gate electrode, depends on the dopant concentration, the mobility of the majority charge carriers and, for a given extension of the channel region in the transistor width direction, on the distance between the source and drain regions, which is also referred to as channel length. Hence, the conductivity of the channel region is a dominant factor determining the performance of MOS transistors.

The continuing shrinkage of the transistor dimensions, however, involves a plurality of issues associated therewith, such as reduced controllability of the channel, also referred to as short channel effects, and the like, that have to be addressed so as to not unduly offset the advantages obtained by steadily decreasing the channel length of MOS transistors. For instance, the thickness of the gate insulation layer, typically an oxide-based dielectric, has to be reduced with reducing the gate length, wherein a reduced thickness may result in increased leakage currents, thereby posing limitations for oxide-based gate insulation layers at approximately 1-2 nm. Thus, the continuous size reduction of the critical dimensions, i.e., the gate length of the transistors, necessitates the adaptation and possibly the new development of highly complex process techniques, for example, for compensating for short channel effects, with oxide-based gate dielectric scaling being pushed to the limits with respect to tolerable leakage currents. It has, therefore, been proposed to also enhance the channel conductivity of the transistor elements by increasing the charge carrier mobility in the channel region for a given channel length, thereby offering the potential of achieving a performance improvement that is comparable with the advance to a future technology node while avoiding or at least postponing many of the problems encountered with the process adaptations associated with device scaling.

One efficient mechanism for increasing the charge carrier mobility is the modification of the lattice structure in the channel region, for instance, by creating tensile or compressive stress in the vicinity of the channel region to produce a corresponding strain in the channel region, which results in a modified mobility for electrons and holes, respectively. For example, creating uniaxial tensile strain in the channel region along the channel length direction for a standard crystallographic orientation increases the mobility of electrons, which in turn may directly translate into a corresponding increase in the conductivity. On the other hand, uniaxial compressive strain in the channel region for the same configuration as above may increase the mobility of holes, thereby providing the potential for enhancing the performance of P-type transistors. The introduction of stress or strain engineering into integrated circuit fabrication is an extremely promising approach for further device generations, since, for example, strained silicon may be considered as a "new" type of semiconductor material, which may enable the fabrication of fast powerful semiconductor devices without requiring expensive semiconductor materials, while many of the well-established manufacturing techniques may still be used.

For this purpose, a plurality of mechanisms have been developed that may be appropriate for creating a desired high strain component in the channel region of transistor elements. For example, dielectric materials, such as silicon nitride, silicon dioxide and the like, may be deposited with a high internal stress level which may be taken advantage of to provide a specific type of strain in the adjacent channel region. Silicon nitride is a frequently used material for forming sidewall spacer elements on sidewalls of gate electrode structures and may be deposited with tensile or compressive stress, which may then be transferred into the channel region via the gate electrode structure. In other approaches, the isolation structures that usually delineate respective active regions of transistor elements may be provided in the form of shallow trench isolations in sophisticated applications, wherein silicon dioxide, silicon nitride and the like may be used as insulating fill materials, which may also be provided in the form of a compressively stressed material, thereby exerting the corresponding stress on the transistor active region, which may finally result in a corresponding strain component in the channel region. In still other approaches, a strain-inducing semiconductor material may be locally incorporated or embedded in the transistor active regions, for instance in the drain and source areas, thereby also creating a corresponding strain in the adjacent channel region.

Moreover, after completing the basic transistor structure, additional strain-inducing mechanisms may be applied, for instance, by providing highly stressed dielectric materials above the transistor structure, for instance in the form of an etch stop material that may typically be used during the patterning of an interlayer dielectric material that is provided for passivating the circuit elements and providing a platform for forming additional wiring levels of the semiconductor device. Thus, transistor performance may be efficiently enhanced on the basis of one or more of the above-identified strain-inducing mechanisms, wherein, however, the finally achieved gain in performance may be less than expected due to a significant "absorption" of stress, which may be caused by the presence of the gate electrode structure. That is, it is assumed that the material of the gate electrode may act as a significant barrier with respect to the stress transfer mechanism, for instance provided by stressed spacer elements, embedded strain-inducing semiconductor material, stress-inducing isolation structures and the like. Since even a moderate increase of transistor performance may be associated with significant efforts with respect to the adaptation or new development of complex manufacturing techniques, as previously described, it is highly desirable to more efficiently exploit any mechanism for enhancing transistor performance, such as any of the above-described strain-inducing mechanisms.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure relates to methods and semiconductor devices in which the deleterious influence of the gate electrode on the stress transfer efficiency may be reduced or may even be used as a strain-inducing source by modifying the structure of the gate electrode and thus the mechanical characteristics thereof in order to enable a more efficient stress transfer into the channel region and/or to additionally create strain in the gate electrode structure. For this purpose, the molecular structure, that is, the crystal quality of the semiconductor material, such as silicon material, silicon/germanium material and the like, may be changed during a high temperature anneal process after implementing one or more strain-inducing mechanisms, thereby enabling more efficient stress transfer into the channel region, which may thus contribute to an increase of transistor performance. In some illustrative aspects disclosed herein, a change of the crystal state of the gate electrode material may be accomplished in a portion of the gate electrode material only, so that a desired high quality interface between the gate electrode material and the gate dielectric layer may be maintained, while nevertheless providing a significant change of a crystalline state of the remaining gate electrode material, thereby enabling an efficient stress transfer during the anneal process. In still other illustrative aspects disclosed herein, a different material composition may be provided in a portion of the gate electrode material so that, in combination with the re-establishing of the crystalline status of the gate electrode material, also the difference in material composition may provide overall a highly efficient strain-inducing effect.

One illustrative method disclosed herein relates to the formation of a transistor element. The method comprises forming a first gate electrode material on a gate dielectric material that is formed above a silicon-containing semiconductor layer, wherein the first gate electrode material has a polycrystalline structure. The method further comprises forming a second gate electrode material on the first gate electrode material, wherein the second gate electrode material has an inferior crystalline quality compared to the first gate electrode material. Additionally, the gate electrode is formed from the first and second gate electrode materials and at least one strain-inducing mechanism is provided for the transistor. Additionally, the method comprises annealing the gate electrode to enhance the crystalline quality of the second gate electrode material.

A further illustrative method disclosed herein comprises depositing a polycrystalline semiconductor material on a dielectric layer in a deposition ambient established on the basis of a predefined parameter setting, wherein the dielectric layer is formed on a silicon-containing semiconductor layer. Moreover, the parameter setting is changed and a further semiconductor material of reduced crystalline quality is deposited on the basis of the changed parameter setting. Moreover, a gate electrode is formed from the polycrystalline semiconductor material and the further semiconductor material that has the reduced crystalline quality. Additionally, the method comprises providing at least one strain-inducing mechanism to create strain in a portion of the semiconductor layer positioned below the gate electrode. Finally, the gate electrode is annealed to enhance the reduced crystalline quality.

One illustrative semiconductor device disclosed herein comprises a polysilicon material formed on a gate dielectric layer of a gate electrode structure of a transistor, wherein the polysilicon material has a first stress level. Moreover, the semiconductor device comprises a silicon-containing semiconductor material formed on the polysilicon material and having a second stress level that differs from the first stress level. Additionally, a metal silicide material is formed on the silicon-containing semiconductor material. Additionally, a strain-inducing component is provided that induces a strain in a channel region of the transistor.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present disclosure provides techniques and semiconductor devices in which the efficiency of strain-inducing mechanisms provided prior to the completion of the basic transistor structure may be increased by increasing the crystalline quality of a significant portion of the gate electrode material, which has been provided in an earlier manufacturing stage with inferior crystalline quality, after implementing respective strain-inducing mechanisms, thereby contributing to an overall enhanced strain in the channel region of the transistor. Without intending to restrict the present disclosure to the following explanation, it is assumed that the "re-crystallization" of a significant portion of the gate electrode material may result in a mechanical configuration of the gate electrode, which in turn is a more direct interaction of the strain-inducing mechanisms into the channel region, since, during the re-crystallization process, the barrier effects of the gate electrode may be reduced. On the other hand, in some illustrative embodiments disclosed herein, desired interface characteristics between the gate dielectric material and the gate electrode material, such as polysilicon, may be maintained by providing an initial portion of the gate electrode material with the desired crystalline quality, that is, in a polycrystalline state with moderately high grain sizes, while, after a specified layer thickness is achieved, the deposition parameters of the deposition ambient may be changed or a further deposition process may be performed to create a reduced grain size, i.e., an inferior crystalline quality, or even deposit a substantially amorphous gate electrode material, which may then be re-crystallized, i.e., the grain size may be increased, on the basis of anneal elevated temperatures. In some illustrative embodiments disclosed herein, the effect of mechanical modification may be even further enhanced and/or the electronic characteristics of a portion of the gate electrode material may be appropriately adapted by introducing other components, such as germanium, tin, carbon and the like, thereby enabling a high degree of flexibility in designing overall transistor characteristics.

Figure 1A:
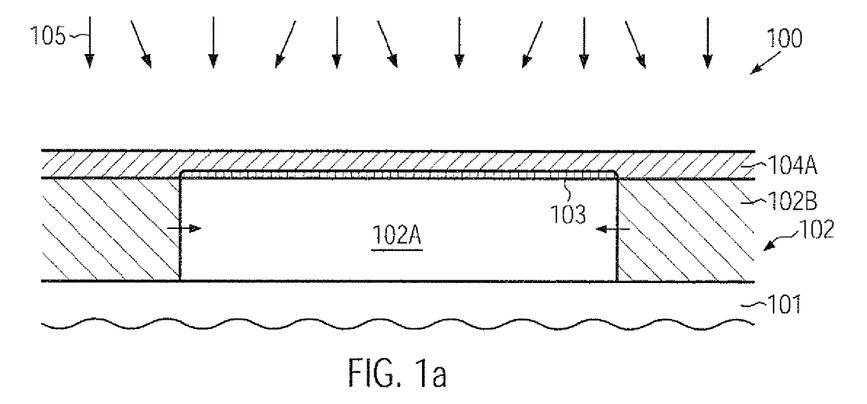
FIGS. 1a-1b schematically illustrate cross-sectional views of a semiconductor device during a deposition of a gate electrode material with a different crystalline quality so as to provide a desired high quality interface with a gate dielectric material and subsequently reducing a crystalline quality, according to illustrative embodiments.

FIG. 1a schematically illustrates a cross-sectional view of a semiconductor device in an initial manufacturing stage for forming a gate electrode of a transistor. As illustrated, the semiconductor device 100 may comprise a substrate 101, above which may be formed a semiconductor layer 102 in which an active region 102a may be defined by an isolation structure 102b, such as a shallow trench isolation and the like. The substrate 101 may represent any appropriate carrier material for forming thereabove the semiconductor layer 102, which may be provided as a silicon-containing semiconductor material in which charge carrier mobility may be enhanced on the basis of corresponding strain-inducing mechanisms. That is, in the silicon-containing semiconductor layer 102, the active region 102A may represent a semiconductor region in and above which one or more transistor elements are to be formed, wherein appropriate strain conditions may be created in order to at least locally increase charge carrier mobility. For example, the active region 102A may represent an active region for forming therein and thereabove a single transistor, such as a P-channel transistor or an N-channel transistor, so that the basic doping in the active region 102A may be adapted to the conductivity type of the transistor to be formed. Moreover, in this manufacturing stage, a gate dielectric material 103 is formed at least above the active region 102A and possibly also above the isolation structure 102B, depending on the manufacturing techniques for forming the gate dielectric material 103. For instance, the material 103 may comprise silicon dioxide, possibly in combination with other components, such as nitrogen and the like, depending on the overall device requirements. Typically, the gate dielectric material 103 may have a thickness of one to several nanometers if sophisticated silicon dioxide-based dielectric materials are considered. Furthermore, a first gate electrode material 104A may be formed above the semiconductor layer 102, that is, on the gate dielectric material 103 and possibly on the isolation structure 102B if a gate dielectric material is not formed thereon. In some illustrative embodiments, the first gate electrode material 104A may be provided in the form of a polysilicon material according to well-established process techniques so that, in combination with a well-established gate dielectric material, such as a silicon dioxide-based material, desired interface characteristics may be accomplished between the material 104A and the gate dielectric material 103. In order to obtain the desired interface characteristics, the first gate electrode material 104A may be provided with a thickness of approximately 3-20 nm, wherein it should be appreciated, however, that any other thickness may be used, if considered appropriate for the further processing of the device 100.

The semiconductor device 100 as shown in FIG. 1a may be formed on the basis of the following processes. Based on well-established process techniques, the isolation structure 102B may be formed, for instance, by etching corresponding trenches into the silicon-containing semiconductor layer 102 on the basis of a lithographically defined etch mask and appropriate dielectric materials may be subsequently filled into the trenches, wherein, if desired, a certain degree of stress may also be generated, for instance, by incorporating stressed silicon nitride material, silicon dioxide material and the like. For instance, compressive stress may be created during the filling in of dielectric material, which may also be transferred to a certain degree into the active region 102A. Thereafter, any excess material may be removed by planarization techniques, such as chemical mechanical polishing (CMP) and the like. Prior to or after forming the isolation structure 102B, an appropriate basic dopant concentration may be introduced into the active region 102A in order to define the corresponding conductivity type of a transistor to be formed therein and thereabove. It should further be appreciated that the substrate 101, in combination with the semiconductor layer 102, may represent a silicon-on-insulator (SOI) configuration when a buried insulating layer (not shown) may be positioned between the substrate material and the semiconductor layer 102. In other cases, the substrate 101, which may be comprised of a substantially crystalline semiconductor material, and the layer 102 may represent a bulk configuration, i.e., the layer 102 may be considered as an upper portion of the crystalline material of the substrate 101. In still other cases, both types of configuration may be present in different device areas of the device 100. Next, the gate dielectric material 103 may be formed, for instance, on the basis of sophisticated oxidation techniques, thereby providing a silicon dioxide based material, possibly in combination with other components, such as nitrogen and the like. In other illustrative embodiments, any other appropriate material composition may be used, for instance by depositing corresponding materials, such as silicon nitride, high-k dielectric materials, which are to be understood as dielectric materials having a dielectric constant of 10.0 or higher, and the like. It should be appreciated that, by using other materials than silicon dioxide based gate dielectrics, the provision of the gate electrode material 104A on the basis of well-established crystalline characteristics may also be advantageous in view of the further processing of the device 100. For example, it may be advantageous with respect to the interface characteristics between the materials 103, 104A, if a significant modification of the molecular structure at this interface may not occur during a corresponding modification of a further gate electrode material still to be formed in a later manufacturing stage. In other illustrative embodiments, however, well-known interface characteristics may be desirable on the basis of gate dielectric materials formed on the basis of silicon dioxide.

Thereafter, the first gate electrode material 104A may be deposited, according to one illustrative embodiment, as a polysilicon material using well-established low pressure chemical vapor deposition (CVD) techniques. Thus, the device 100 may be exposed to a deposition ambient 105 in which appropriate precursor gases may be supplied on the basis of well-established deposition recipes. During the deposition 105, elevated temperatures may be applied so that the substrate temperature of the device 100 and thus also the surface temperature of the device 100 may be at a specified temperature that provides a moderately high grain size of the gate electrode material 104A, such as a polysilicon material. It is well known that the crystalline quality of a polysilicon material may strongly depend, among other things, on the process temperature. For example, for otherwise given process parameters and for a given deposition surface, such as the gate dielectric material 103, the crystalline quality and thus the grain size may be controlled by the substrate temperature, which may be in the range of approximately 500-700° C. Consequently, during the deposition process 105, the first gate electrode material 104A may be provided in the form of a polycrystalline semiconductor material having a desired high crystalline quality in order to obtain desired interface characteristics with the gate dielectric material 103.

Figure 1B:
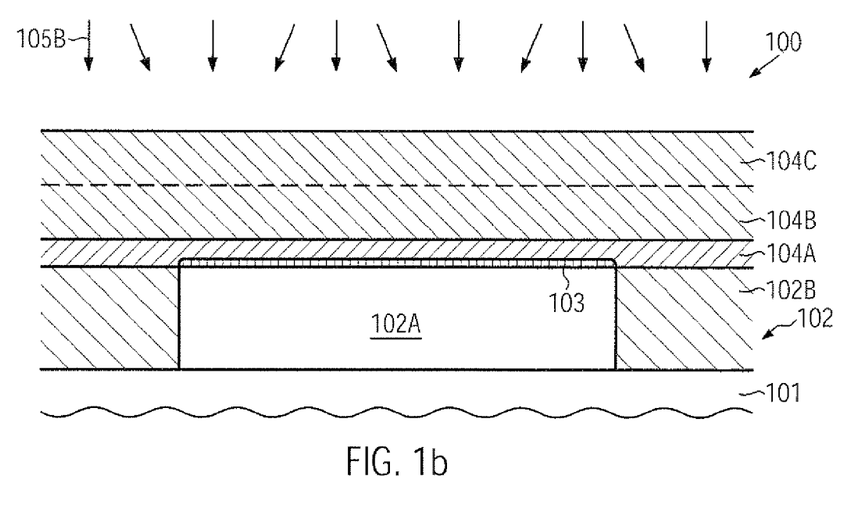

FIG. 1b schematically illustrates the semiconductor device 100 in an advanced manufacturing stage in which the device 100 is exposed to a further deposition ambient 105B in order to provide at least one further gate electrode material 104B, 104C having an inferior crystalline quality compared to the first gate electrode material 104A. In one illustrative embodiment, the deposition ambient 105B represents the same deposition ambient as used in the process 105 of FIG. 1a wherein, however, at least one process parameter may be changed in order to reduce the corresponding crystalline quality, i.e., the grain size of the material deposited, or to provide a substantially amorphous semiconductor material. For instance, as previously explained, the substrate temperature may represent an appropriate deposition parameter that may be changed to influence the crystalline quality of the semiconductor material deposited. In other illustrative embodiments, the deposition ambient 105B may represent a separate process, which may even be performed in a separate process tool, if required. Thus, during the deposition process 105B, one or more gate electrode materials 104B, 104C may be provided with different crystalline characteristics, while, in other cases, a substantially non-crystalline quality may be accomplished. For instance, the crystalline quality may gradually decrease starting from the material of the layer 104A, wherein even a substantially amorphous material may be obtained at an upper portion of the gate electrode material 104C.

Figure 1C:
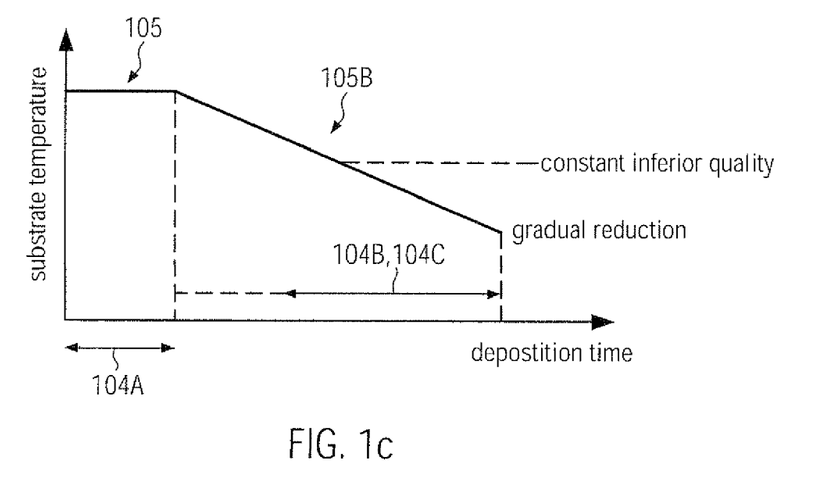
FIG. 1c schematically illustrates a change in parameter settings of a deposition ambient in order to reduce the crystalline quality of a semiconductor material for a gate electrode structure, according to illustrative embodiments.

FIG. 1c schematically illustrates a change of the parameter settings according to one illustrative embodiment, wherein the deposition ambient in FIG. 1a and FIG. 1b, i.e., the processes 105, 105B, may be performed in the same process tool, wherein the temperature may be reduced during the process 105B in order to gradually reduce the crystalline quality, i.e., the grain size, of the materials 104B, 104C. As is illustrated in FIG. 1c, the substrate temperature may be maintained at a desired value for a specified deposition time in order to obtain a desired thickness for the first gate electrode material 104A. Thereafter, the substrate temperature may be reduced wherein, depending on the desired material characteristics, the deposition may be continued or a corresponding phase without deposition may be provided and the supply of corresponding precursor gases may be re-established after a desired substrate temperature is obtained. Thereafter, the deposition may be continued at a substantially constant temperature or the temperature may further be reduced, thereby obtaining a further reduction of the crystalline quality, i.e., of the grain size, of materials 104B, 104C. Thus, a high degree of flexibility in adjusting the overall crystalline characteristics of the materials 104B, 104C may be obtained on the basis of changing the substrate temperature during the deposition phase 105B. For instance, after depositing the material 104A, the substrate temperature may be lowered to a specific value which provides a substantially amorphous crystalline state of the materials 104B, 104C, thereby providing a moderately high degree of mechanical modification during a corresponding anneal process to be performed in a later manufacturing stage.

In some illustrative embodiments, during the deposition of the gate electrode materials 104B and/or 104C, other process parameters may be changed in order to influence the crystalline quality. For instance, the deposition pressure, the gas flow rates and the like may be changed. In some illustrative embodiments, in addition to changed process parameters for reducing the crystalline quality of the materials 104B, 104C, at any appropriate deposition phase, additional materials may be supplied to the deposition ambient, for instance in the form of germanium-containing precursors, tin-containing precursors, carbon-containing precursors and the like, in order to provide desired electronic characteristics and also "amplify" the effect of the mechanical modification upon re-crystallizing the materials 104B, 104C having the inferior crystalline quality. For instance, a silicon/germanium mixture may be deposited with a fraction of germanium of up to approximately 35 atomic percent, while, in other cases, tin may be incorporated, possibly in combination with germanium, in order to obtain a silicon/tin/germanium mixture, while, in other cases, carbon may be introduced with a fraction of up to several atomic percent.

Thereafter, the further processing may be continued on the basis of well-established process techniques.

Figure 1D:
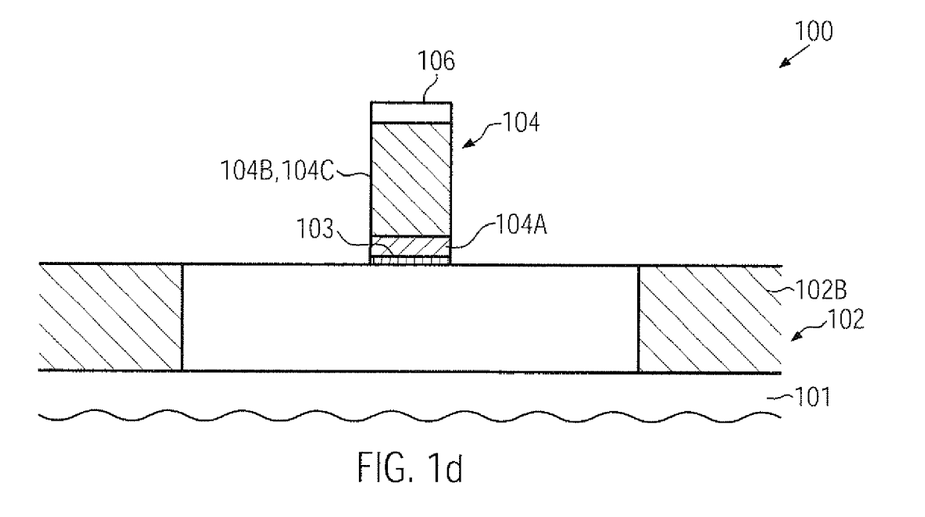
FIGS. 1d-1i schematically illustrate cross-sectional views of the semiconductor device during various manufacturing stages in providing one or more strain-inducing mechanisms, the stress transfer efficiency of which may be increased by modifying the crystalline status of the gate electrode material, according to illustrative embodiments.

FIG. 1d schematically illustrates the device 100 in a further advanced manufacturing stage. As illustrated, the device 100 may comprise a gate electrode 104 comprising the materials 104A of enhanced crystalline quality and one or more of the materials 104B, 104C of inferior crystalline quality, as previously explained. Furthermore, in some illustrative embodiments, a cap layer 106, for instance comprised of silicon nitride and the like, may be formed on top of the gate electrode 104. The gate electrode 104 may be formed on the basis of sophisticated lithography and etch techniques in order to obtain a desired gate length, i.e., in FIG. 1d, the horizontal extension of the gate electrode 104, which may be approximately 50 nm and less in advanced semiconductor devices.

Figure 1E:
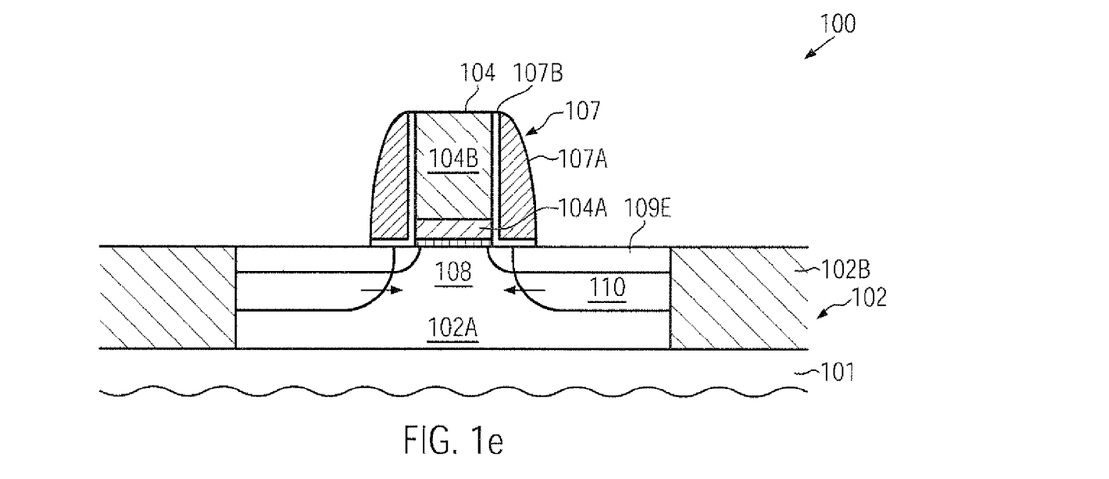

FIG. 1e schematically illustrates the semiconductor device 100 in a further advanced manufacturing stage. As illustrated, a spacer structure 107 is formed on sidewalls of the gate electrode 104, wherein, in some illustrative embodiments, the spacer structure 107 may comprise at least one spacer element 107A that may have an internal stress level, such as compressive or tensile, in order to create a corresponding strain component in a channel region 108 positioned below the gate electrode 104. Furthermore, in some illustrative embodiments, an additional strain-inducing mechanism may be provided in the active region 102A, for instance in the form of an embedded strained semiconductor alloy 110, which may be provided in the form of a silicon/germanium material, a silicon/tin material, a silicon/germanium/tin material, a silicon/carbon material and the like. Typically, these semiconductor alloys have a natural lattice constant that is different from the lattice constant of the silicon-based material in the active region 102A. Consequently, upon forming the semiconductor alloys 110 by selective epitaxial growth techniques, these materials may be grown in a strained state, which in turn provides a corresponding strain component in the adjacent channel region 108. Furthermore, drain and source extension regions 109E may be formed in the active region 102A.

The semiconductor device 100 as shown in FIG. 1e may be formed on the basis of process strategies in which a respective cavity may be formed near the gate electrode 104 by providing corresponding sidewall spacers (not shown), which may act as an etch mask and a growth mask during the further processing of the device 100. Hence, after forming the corresponding cavities, the material 110 may be filled in on the basis of well-established selective epitaxial growth techniques, thereby obtaining a desired strained state of the material 110, which may also be transferred to a certain degree into the channel region 108. Thereafter, the cap layer 106 (see FIG. 1d) and respective sidewalls spacers, as well as other hard mask layers used for other device regions, may be removed and the extension regions 109E may be formed, for instance in combination with appropriate offset spacer elements (not shown), by applying respective implantation techniques. Thereafter, the spacer structure 107 may be formed, for instance by depositing an etch stop liner 107B followed by the deposition of a spacer material, such as silicon nitride, which may be provided with a desired type of internal stress, such as compressive or tensile, depending on the type of strain to be induced in the channel region 108. Thereafter, the spacer material may be patterned by using well-established anisotropic etch techniques, thereby providing the spacer element 107A.

Figure 1F:
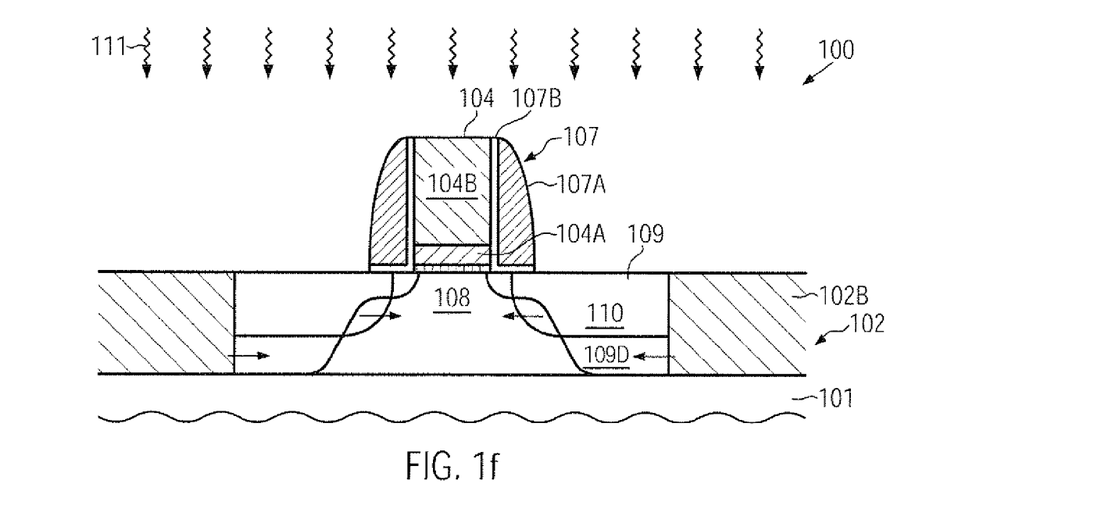

FIG. 1f schematically illustrates the semiconductor device 100 in a further advanced manufacturing stage. As illustrated, deep drain and source regions 109D may be formed within the active region 102A, which may be accomplished by performing corresponding implantation processes based on the spacer structure 107. Thus, the device 100 may comprise at least one strain-inducing mechanism, such as the stressed isolation structure 102B (see FIG. 1d) and/or the strain-inducing semiconductor alloy 110 and/or the stressed spacer elements 107A. However, the gate electrode 104 may act as a "barrier," thereby reducing the efficiency of the strain transfer for these strain-inducing mechanisms. For this reason, an anneal process 111 may be performed at elevated temperatures, for instance in the range of approximately 900-1200° C. and even higher, in which a mechanical modification of the gate electrode 104 may occur, thereby also reducing the "barrier" effect of the gate electrode 104 during the process 111, thereby creating an enhanced strain component in the channel region 108, which may then be preserved after the process 111. For instance, the process 111 may be performed on the basis of well-established flashlight, laser-based, rapid thermal anneal techniques, thereby also activating the dopants in the drain and source regions 109 and re-crystallizing implantation-induced damage therein. At the same time, the crystalline quality of the portion 104B, which may even include a substantially amorphous material, may be converted into a polycrystalline material, thereby resulting in a corresponding mechanical modification, for instance caused by a change in volume of the different crystalline states of the material 104B.

As previously indicated, in some illustrative embodiments, the mechanical modification may be increased by providing an appropriate material mixture, such as silicon/germanium, silicon/carbon and the like, which may further increase a corresponding discrepancy in mechanical characteristics, such as volume upon re-crystallizing the portion 104B. Furthermore, the overall electronic characteristics may be adjusted, for instance the overall conductivity may be increased by adding a germanium component in the material 104B.

Figure 1G:
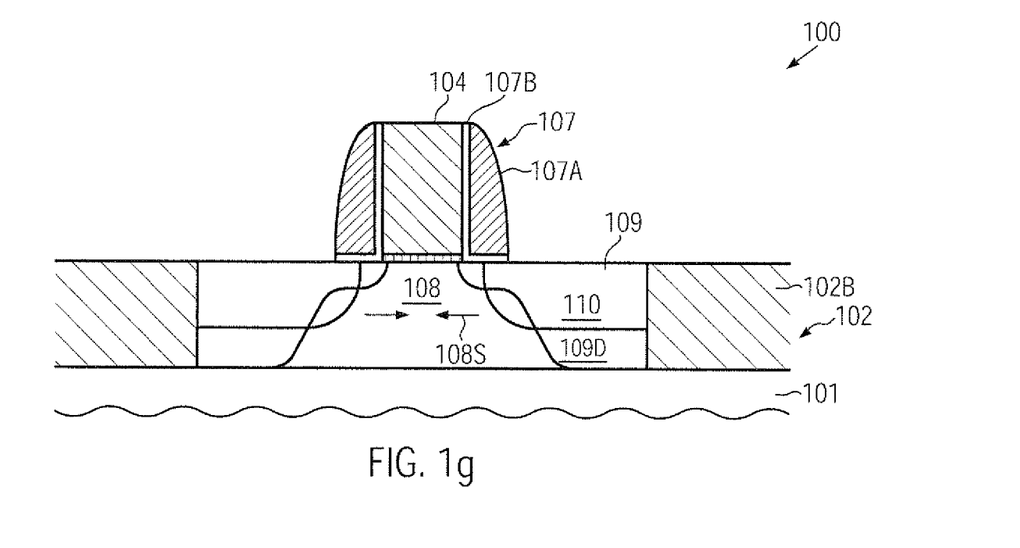

FIG. 1g schematically illustrates the semiconductor device 100 after completion of the anneal process. Hence, the gate electrode 104 may comprise material of high crystalline quality, which may substantially correspond to the initial crystalline quality of the material 104A (FIG. 1f), wherein, as previously described, the semiconductor components, such as germanium, carbon and the like, may also be present. Furthermore, due to the previous modification of the gate electrode 104, an increased strain component 108S may be present in the channel region 108 caused by one or more of the above-identified strain-inducing mechanisms. It should be appreciated that any type of strain, such as tensile or compressive strain, may be provided in the channel region 108, depending on the overall transistor characteristics. For example, the device 100 may represent a P-channel transistor in which one or more compressive strain-inducing mechanisms may be implemented so that the resulting strain component 108S may represent a compressive strain component. In other cases, the device 100 may represent an N-channel transistor wherein a tensile strain component may enhance overall transistor performance.

Figure 1H:
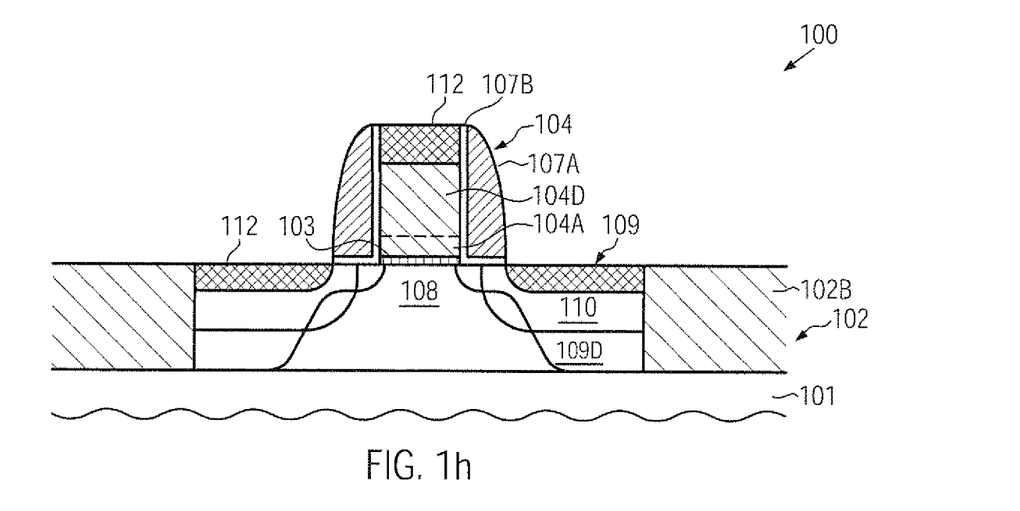

FIG. 1h schematically illustrates the semiconductor device 100 in a further advanced manufacturing stage in which metal silicide regions 112 may be formed in the drain and source regions 109 and in the gate electrode 104. For this purpose, well-established process strategies may be applied. Furthermore, as illustrated, the gate electrode 104 may comprise the first gate electrode material 104A having substantially the initial high crystalline quality and a corresponding intrinsic stress level that may correspond to the overall stress conditions in the device 100 in the vicinity of the channel region 108. Moreover, a portion 104D provided above the first gate electrode material 104A may have an internal stress level that differs from the stress level of the material 104A due to a previously performed re-crystallization during which an enhanced stress transfer into the channel region 108 may be accomplished for one or more of the strain-inducing mechanisms, as previously described. Furthermore, in some cases, the portion 104D may comprise a different material composition compared to the first gate electrode material 104A due to the incorporation of any desired species, such as germanium, carbon, tin and the like. Thus, in addition to providing an enhanced strain component in the channel region 108, overall characteristics of the gate electrode 104 may also be adjusted with a high degree of flexibility by incorporating any desired atomic species, if desired. On the other hand, due to the initially provided material 104A having the desired high crystalline quality, respective interface characteristics with respect to the gate dielectric material 103 may be maintained.

Thereafter, further processing may be continued, for instance by depositing a strain-inducing dielectric material, such as a silicon nitride material, a nitrogen-containing silicon carbide material and the like, followed by the deposition of an appropriate interlayer dielectric material, such as silicon dioxide and the like.

Figure 1I:
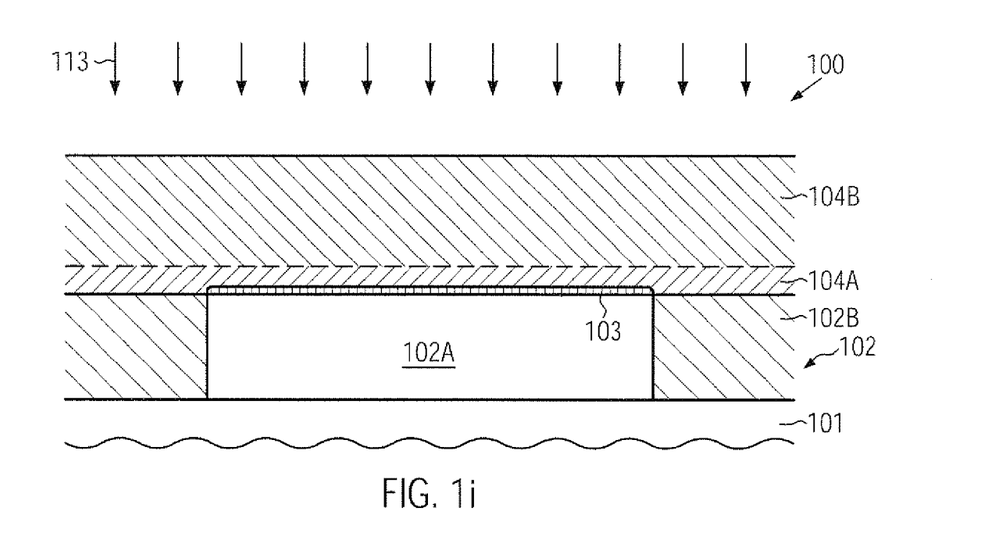

FIG. 1*i* schematically illustrates the semiconductor device 100 in an early manufacturing stage according to still further illustrative embodiments. As shown, the device 100 comprises the gate electrode materials 104A, 104B of different crystalline qualities, wherein the material 104A may be provided in a high crystalline quality, while the material 104B may have an inferior crystalline quality, for instance it may be provided in a substantially amorphous state. For this purpose, initially, the polycrystalline gate electrode material may be deposited with a desired high quality up to a defined thickness as required for the further processing of the device 100. Thereafter, the device 100 may be exposed to an ion bombardment 113, for instance performed as an ion implantation process on the basis of any appropriate implantation species. For example, germanium, silicon, xenon and the like may be used to modify the crystalline structure down to a specified depth, thereby forming the gate electrode material 104B. For instance, during the ion bombardment 113, a corresponding desired species may be incorporated, such as germanium, tin and the like, in order to not unduly create a respective crystalline damage but also adjust the overall electronic characteristics of the gate electrode to be formed from the layers 104A, 104B. Appropriate parameters for the implantation process 113 may readily be determined on the basis of simulation programs, test runs and the like. Thus, after the ion bombardment 113, the further processing may be continued as previously described in order to enhance the overall stress transfer efficiency.

As a result, the present disclosure provides semiconductor devices and techniques for forming the same in which the stress transfer efficiency of one or more strain-inducing mechanisms, which may be provided prior to completing the basic transistor configuration, may be enhanced by a mechanical modification of the gate electrode. For this purpose, the gate electrode material may be provided with different crystalline qualities so as to maintain desired interface characteristics in combination with a desired gate dielectric material, while on the other hand providing a significant change of the crystalline structure upon annealing the gate electrode structure after patterning the same and after implementing one or more strain-inducing mechanisms. Consequently, overall transistor performance may be increased while not unduly contributing to overall process complexity since, in some illustrative embodiments, a corresponding modification of the mechanical characteristics of the gate electrode may be accomplished without any additional process steps.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a transistor, comprising:
   forming a first gate electrode material on a gate dielectric material that is formed above a silicon-containing semiconductor layer, said first gate electrode material having a polycrystalline structure and comprising a plurality of first grains;
   forming a second gate electrode material on said first gate electrode material, said second gate electrode material having a polycrystalline structure and comprising a plurality of second grains, wherein a grain size of at least some of said plurality of second grains is smaller than a grain size of said plurality of first grains;
   forming a gate electrode from said first and second gate electrode materials;
   providing at least one strain-inducing mechanism for said transistor; and
   after providing said at least one strain-inducing mechanism, increasing said grain size of at least some of said plurality of second grains, wherein increasing said grain size comprises annealing said gate electrode.

2. The method of claim 1, wherein forming said first and second gate electrode materials comprises depositing said first gate electrode material in a deposition ambient on the basis of a predefined parameter set and changing a value of at least one parameter of said parameter set to deposit said second gate electrode material.

3. The method of claim 2, wherein said at least one parameter represents a substrate temperature.

4. The method of claim 3, wherein said substrate temperature is reduced after forming said first gate electrode material.

5. The method of claim 1, wherein said first and second gate electrode materials are formed by depositing a silicon material.

6. The method of claim 1, wherein forming said second gate electrode material comprises depositing a silicon/germanium mixture.

7. The method of claim 1, wherein providing said at least one strain-inducing mechanism comprises forming a strain-inducing semiconductor alloy in drain and source regions of said transistor.

8. The method of claim 1, wherein providing said at least one strain-inducing mechanism comprises forming a stressed spacer element on sidewalls of said gate electrode.

9. The method of claim 1, wherein providing said at least one strain-inducing mechanism comprises forming a stressed isolation structure that laterally delineates said transistor.

10. The method of claim 1, further comprising forming a third gate electrode material on said second gate electrode material and forming said gate electrode from said third gate electrode material, wherein said third gate electrode material comprises at least one of an amorphous material and a polycrystalline material comprising a plurality of third grains, wherein a grain size of at least some of said plurality of third grains is smaller than a grain size of said pluralities of first and second grains.

11. The method of claim 1, wherein, after annealing said gate electrode, said grain size of said plurality of second grains is substantially the same as said grain size of said plurality of first grains.

12. A method, comprising:
depositing a first polycrystalline semiconductor material comprising a plurality of first grains on a dielectric layer in a deposition ambient established on the basis of a predefined parameter setting, said dielectric layer being formed on a silicon-containing semiconductor layer;
changing said parameter setting;
depositing a further semiconductor material using said changed parameter setting, wherein depositing said further semiconductor material comprises forming at least a second polycrystalline semiconductor material comprising a plurality of second grains, wherein a grain size of at least some of said plurality of second grains is smaller than a grain size of said plurality of first grains;
forming a gate electrode from said polycrystalline semiconductor material and said further semiconductor material;
providing at least one strain-inducing mechanism so as to create strain in a portion of said silicon-containing semiconductor layer positioned below said gate electrode; and
annealing said gate electrode so as to increase said grain size of at least some of said plurality of second grains.

13. The method of claim 12, wherein said parameter setting is changed so as to achieve a substantially continuous reduction of said grain size of said plurality of second grains.

14. The method of claim 12, wherein changing said parameter setting comprises reducing a temperature in said deposition ambient.

15. The method of claim 12, further comprising changing supply of precursor materials to said deposition ambient.

16. The method of claim 15, wherein said semiconductor material is deposited in the form of a silicon material and wherein changing supply of precursor materials comprises supplying at least one non-silicon precursor material to said deposition ambient.

17. The method of claim 16, wherein said at least one non-silicon precursor material comprises at least one of germanium and tin.

18. The method of claim 12, wherein depositing said further semiconductor material comprises forming an amorphous semiconductor material.

19. The method of claim 18, wherein annealing said gate electrode comprises crystallizing said amorphous semiconductor material.

20. A method, comprising:
forming a gate dielectric material above a silicon-containing semiconductor layer;
forming a first polycrystalline material above said gate dielectric material;
forming an amorphous material above said first polycrystalline material
forming a gate electrode from said first polycrystalline material and said amorphous material;
providing at least one strain-inducing mechanism so as to create strain in a portion of said silicon-containing semiconductor layer positioned below said gate electrode; and
after providing said at least one strain-inducing mechanism, annealing said gate electrode, wherein annealing said gate electrode comprises crystallizing said amorphous material.

21. The method of claim 20, further comprising forming a second polycrystalline material above said first polycrystalline material and forming said gate electrode from said second polycrystalline material, wherein said first polycrystalline material comprises a plurality of first grains and said second polycrystalline material comprises a plurality of second grains having a grain size that is smaller than a grain size of said plurality of first grains, and wherein annealing said gate electrode comprises increasing said grain size of said plurality of second grains.

22. The method of claim 20, wherein forming said amorphous material comprises forming said first polycrystalline material with excess thickness and performing an ion bombardment to amorphize an upper portion only of said first polycrystalline material.

23. The method of claim 22, wherein said ion bombardment is performed by using at least one of a silicon species, a germanium species and a xenon species.

* * * * *